United States Patent
Kim

(10) Patent No.: US 9,640,234 B2
(45) Date of Patent: May 2, 2017

(54) SEMICONDUCTOR MEMORY APPARATUS

(71) Applicant: SK hynix Inc., Icheon-si, Gyeonggi-do (KR)

(72) Inventor: Kyu Sung Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/187,000

(22) Filed: Jun. 20, 2016

(65) Prior Publication Data

US 2016/0293233 A1 Oct. 6, 2016

Related U.S. Application Data

(62) Division of application No. 14/082,353, filed on Nov. 18, 2013, now Pat. No. 9,401,191.

(30) Foreign Application Priority Data

Aug. 22, 2013 (KR) .......................... 10-2013-0099818

(51) Int. Cl.
| | |
|---|---|
| *G11C 7/12* | (2006.01) |
| *G11C 8/08* | (2006.01) |
| *G11C 11/419* | (2006.01) |
| *G11C 7/10* | (2006.01) |
| *G11C 7/14* | (2006.01) |

(52) U.S. Cl.
CPC .................. *G11C 7/12* (2013.01); *G11C 7/10* (2013.01); *G11C 7/14* (2013.01); *G11C 8/08* (2013.01); *G11C 11/419* (2013.01)

(58) Field of Classification Search
CPC ..................................... G11C 7/12; G11C 7/10
USPC ....................................................... 365/189.07
See application file for complete search history.

(56) References Cited

U.S. PATENT DOCUMENTS

| | | | |
|---|---|---|---|
| 2003/0189853 A1* | 10/2003 | Tanizaki ................ | G11C 7/062 365/200 |
| 2012/0106242 A1* | 5/2012 | Lee .......................... | G11C 7/04 365/163 |
| 2014/0361233 A1* | 12/2014 | Kim .................. | H01L 29/66666 257/2 |

* cited by examiner

*Primary Examiner* — Hoai V Ho
*Assistant Examiner* — Muna A Techane
(74) *Attorney, Agent, or Firm* — William Park & Associates Ltd.

(57) ABSTRACT

A semiconductor memory apparatus includes a driving current control block configured to sense a resistance value of a dummy memory element, and generates a write driver control signal; and a write driving block configured to provide a driving voltage to a memory cell array in response to a write driver enable signal and the write driver control signal.

10 Claims, 6 Drawing Sheets

SEMICONDUCTOR MEMORY APPARATUS

CROSS-REFERENCES TO RELATED APPLICATION

The present application is a Division of U.S. application Ser. No. 14/082,353, filed on Nov. 18, 2013, and present application claims priority under 35 U.S.C. §119(a) to Korean application number 10-2013-0099818, filed on Aug. 22, 2013, in the Korean Intellectual Property Office, which is incorporated herein by reference in its entirety.

BACKGROUND

1. Technical Field

Various embodiments generally relate to a semiconductor integrated circuit, and more particularly, to a semiconductor memory apparatus.

2. Related Art

A semiconductor memory apparatus is configured to store data and output stored data.

The kinds of semiconductor memory apparatuses are determined according to methods of storing data.

Among the methods of storing data, there is a method of storing the value of data by changing the resistance value of a memory element according to the amount of current applied to the memory element.

Such a memory element has one end which is applied with current and the other end which flows current to a ground terminal. The other end through which the memory element flows current to the ground terminal, that is, the bottom electrode of the memory element may be changed in its resistance value according to a process, a voltage and a temperature.

If the resistance value of the bottom electrode of the memory element is changed, an amount of current to be applied to the memory element to change the value of data should be changed. However, currently, only a technology capable of applying only a specified amount of current to a memory element is being used.

SUMMARY

A semiconductor memory apparatus which may supply current conforming to the characteristic of a memory element, to the memory element, is described herein.

In an embodiment of the present invention, a semiconductor memory apparatus includes: a driving current control block configured to sense a resistance value of a dummy memory element, and generate a write driver control signal; and a write driving block configured to provide a driving voltage to a memory cell array in response to a write driver enable signal and the write driver control signal.

In an embodiment of the present invention, a semiconductor memory apparatus includes: a driving current control block configured to generate a plurality of write driver control signals according to resistance values of a plurality of dummy memory elements; a main driver configured to provide a driving voltage to a memory cell array in response to a write driver enable signal; and a plurality of sub drivers configured to provide the driving voltage to the memory cell array in response to the plurality of write driver control signals when the write driver enable signal is enabled.

In an embodiment of the present invention, a semiconductor memory apparatus includes: a driving current control block configured to be applied with an option signal from a controller or test equipment, sense resistance values of a plurality of dummy memory elements during an enable period of the option signal, and generate a plurality of write driver control signals; and a write driving block configured to determine the number of write drivers for generating a driving voltage, in response to a write driver enable signal and the plurality of write driver control signals.

In an embodiment of the present invention, a semiconductor memory apparatus includes: a driving current control block configured to sense a resistance value of a dummy memory element, and generate at least one write driver control signal; and a write driving block configured to increase or decrease a number of drivers for generating a driving voltage according to the number of received write driver control signals and provide the driving voltage to a memory cell array.

In an embodiment of the present invention, a microprocessor, includes: a control unit configured to receive a signal including a command from the outside and perform extraction or decryption of the command or input or output control; an operation unit configured to perform an operation according to a decryption result of the command in the control unit; and a storage unit configured to store one or more among data to be operated, data corresponding to a result of the operation, and an address for the data to be operated, wherein the storage unit includes a semiconductor memory apparatus includes: a driving current control block configured to sense a resistance value of a dummy memory element, and generate a write driver control signal; and a write driving block configured to provide a driving voltage to a memory cell array in response to a write driver enable signal and the write driver control signal.

In an embodiment of the present invention, a processor includes: a core unit configured to perform an operation corresponding to a command input from the outside using data according to the command; a cache semiconductor device unit configured to store one or more among data to be operated, data corresponding to a result of the operation, and an address for the data to be operated; and a bus interface configured to be connected between the core unit and the cache semiconductor device unit, and transmit data between the core unit and the cache semiconductor device unit, wherein the cache semiconductor device unit includes a semiconductor memory apparatus includes: a driving current control block configured to sense a resistance value of a dummy memory element, and generate a write driver control signal; and a write driving block configured to provide a driving voltage to a memory cell array in response to a write driver enable signal and the write driver control signal.

In an embodiment of the present invention, a processor includes: a processor configured to interpret a command input from the outside and control an operation of information according to an interpretation result of the command; an auxiliary storage device configured to store a program for interpretation of the command, and the information; a main storage device configured to transfer the program and information from the auxiliary storage device and store the program and the information so that the processor performs the operation using the program and information when the program is executed; and an interface device configured to perform communication between the outside and one or more among the processor, the auxiliary storage device, and the main storage device, wherein at least one of the auxiliary storage device and the main storage device includes a semiconductor memory apparatus includes: a driving current control block configured to sense a resistance value of a dummy memory element, and generate a write driver control signal; and a write driving block configured to provide a driving voltage to a memory cell array in response to a write driver enable signal and the write driver control signal.

Thanks to the above embodiments, the semiconductor memory apparatus according to the present disclosure may supply current conforming to the characteristic of a memory element, to the memory element, whereby it is possible to improve the margin and reliability of an operation for storing data.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through various examples of embodiments.

Figure 1:
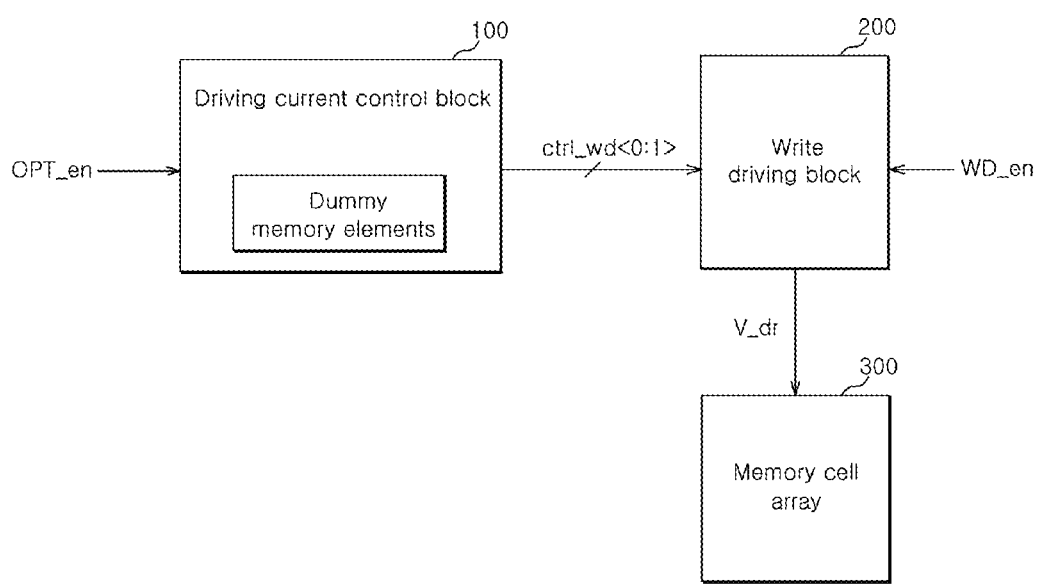
FIG. 1 is a configuration diagram of a semiconductor memory apparatus in accordance with an embodiment of the present disclosure.

Referring to FIG. 1, a semiconductor memory apparatus in accordance with an embodiment of the present disclosure may include a driving current control block 100, a write driving block 200, and a memory cell array 300.

The driving current control block 100 may be inputted with an option signal OPT_en from a controller which controls the semiconductor memory apparatus or test equipment which tests the semiconductor memory apparatus, or may be inputted with a signal generated inside the semiconductor memory apparatus, as the option signal OPT_en.

The driving current control block 100 is configured to sense the resistance values of dummy memory elements during the enable period of the option signal OPT_en, and generate first and second write driver control signals ctrl_wd<0:1>. The driving current control block 100 retains the values of the first and second write driver control signals ctrl_wd<0:1> generated by sensing the resistance values of the dummy memory elements, even after the option signal OPT_en is disabled. The dummy memory elements may be memory elements which are included in the memory cell array 300. Also, the dummy memory elements may be memory elements which are formed by modeling memory elements included in the memory cell array 300. The dummy memory elements are not used as memory elements for storing data in the data writing operation of the semiconductor memory apparatus, and are memory elements which are formed through the same processes as memory elements for storing data in the data writing operation of the semiconductor memory apparatus.

The write driving block 200 is configured to determine the number of drivers for driving a driving voltage V_dr, in response to a write driver enable signal WD_en and the plurality of write driver control signals ctrl_wd<0:1>. For example, the write driving block 200 increases or decreases the number of drivers for generating the driving voltage V_dr, according to the number of enabled write driver control signals of the first and second write driver control signals ctrl_wd<0:1> when the write driver enable signal WD_en is enabled.

The memory cell array 300 includes memory elements for storing data. The memory elements are resistive memory elements which have resistance values corresponding to the values of data.

Figure 2:
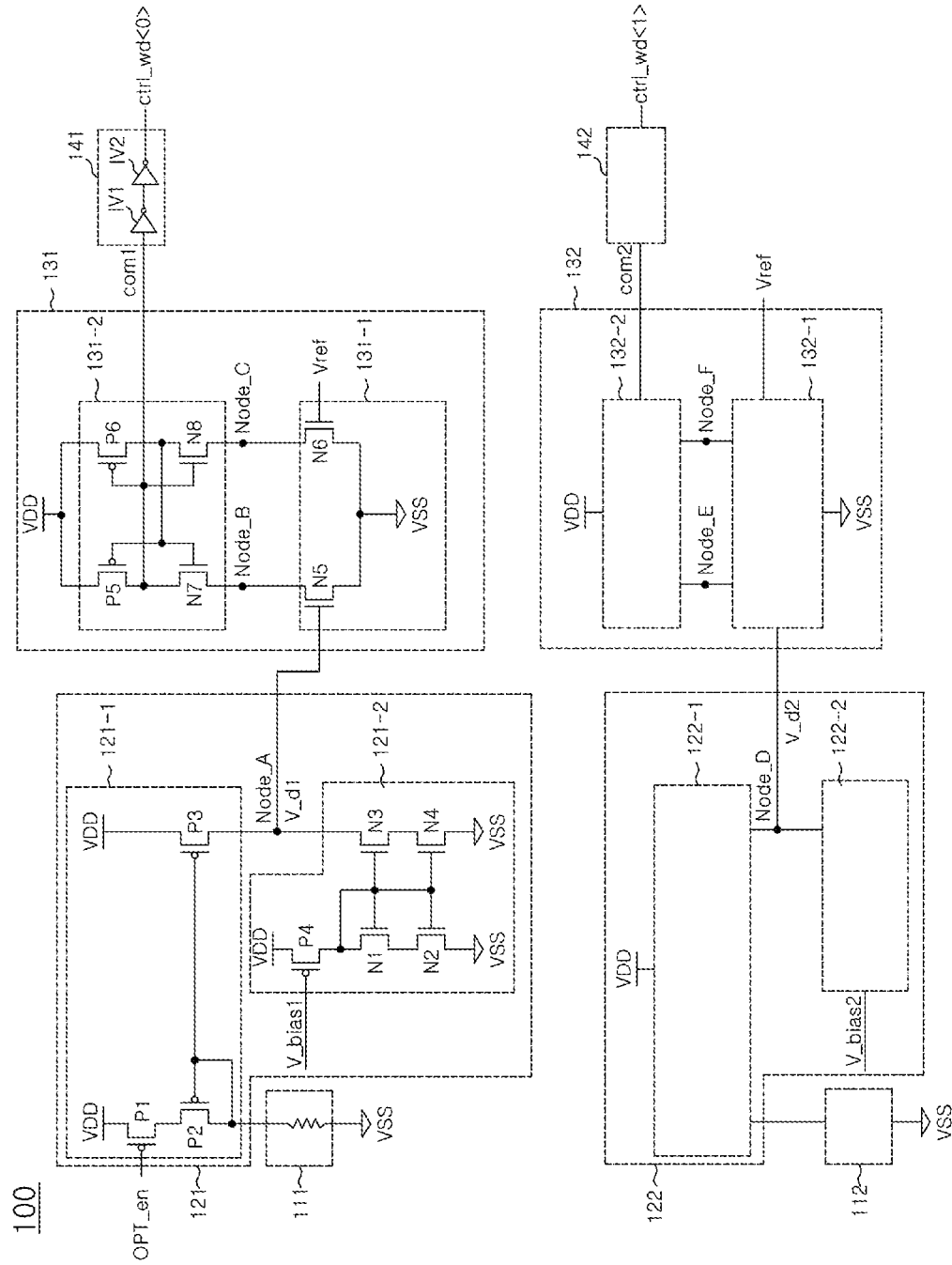
FIG. 2 is a configuration diagram of the driving current control block of FIG. 1.

Referring to FIG. 2, the driving current control block 100 generates first and second sensing voltages V_d1 and V_d2 which correspond to the resistance values of first and second dummy memory elements 111 and 112, compares the first and second sensing voltages V_d1 and V_d2 and a reference voltage V_ref, and generates the first and second write driver control signals ctrl_wd<0:1>.

The driving current control block 100 includes the first and second dummy memory elements 111 and 112, first and second sensing voltage generation units 121 and 122, first and second latch type comparison units 131 and 132, and first and second drivers 141 and 142.

The first sensing voltage generation unit 121 is configured to apply a voltage to the first dummy memory element 111, and generate the first sensing voltage V_d1 which corresponds to the resistance value of the first dummy memory element 111.

The first sensing voltage generation unit 121 includes a first current generating section 121-1 and a first voltage converting section 121-2.

The first current generating section 121-1 is configured to apply a voltage to the first dummy memory element 111, and generate the same current as the current supplied to the first dummy memory element 111.

The first current generating section 121-1 includes first to third transistors P1, P2 and P3. The first transistor P1 has the gate which is inputted with the option signal OPT_en, and the source which is applied with an external voltage VDD. The second transistor P2 has the source to which the drain of the first transistor P1 is electrically coupled, the drain to which one end of the first dummy memory element 111 is electrically coupled, and the gate to which the drain is electrically coupled. A ground terminal VSS is electrically coupled to the other end of the first dummy memory element 111. The third transistor P3 has the gate to which the gate of the second transistor P2 is electrically coupled, the source which is applied with the external voltage VDD, and the drain to which a first node Node_A is electrically coupled.

The first voltage converting section 121-2 is configured to generate the first sensing voltage V_d1 of a voltage level that corresponds to the amount of current generated by the first current generating section 121-1. For example, the first voltage converting section 121-2 is electrically coupled to the first node Node_A, and the first node Node_A is supplied with the current generated by the first current generating section 121-1. The first voltage converting section 121-2 flows the amount of current corresponding to a first bias voltage V_bias1, from the first node Node_A to the ground terminal VSS. If the amount of the current supplied to the first node Node_A, that is, the current generated by the first current generating section 121-1, is larger than the amount of current which is flowed to the ground terminal VSS by the first voltage converting section 121-2, the voltage of the first node Node_A rises. If the amount of the current supplied to the first node Node_A, that is, the current generated by the first current generating section 121-1, is smaller than the amount of current which is flowed to the ground terminal VSS by the first voltage converting section 121-2, the voltage of the first node Node_A falls or decreases.

The first voltage converting section 121-2 includes fourth to eighth transistors P4, N1, N2, N3 and N4. The fourth transistor P4 has the gate which is applied with the first bias voltage V_bias1, and the source which is applied with the external voltage VDD. The fifth transistor N1 has the drain to which the drain of the fourth transistor P4 is electrically coupled, and the gate to which the drain is electrically coupled. The sixth transistor N2 has the gate to which the drain of the fourth transistor P4 is electrically coupled, the drain to which the source of the fifth transistor N1 is electrically coupled, and the source to which the ground terminal VSS is electrically coupled. The seventh transistor N3 has the gate to which the drain of the fourth transistor P4 is electrically coupled, and the drain to which the first node Node_A is electrically coupled. The eighth transistor N4 has the gate to which the drain of the fourth transistor P4 is electrically coupled, the drain to which the source of the seventh transistor N3 is electrically coupled, and the source to which the ground terminal VSS is electrically coupled.

The first latch type comparison unit 131 is configured to compare the first sensing voltage V_d1 and the reference voltage V_ref, and generate a first comparison signal com1.

The first latch type comparison unit 131 includes a first comparing section 131-1 and a first latch section 131-2.

The first comparing section 131-1 is configured to determine the voltage levels of a second node Node_B and a third node Node_C according to the voltage levels of the first sensing voltage V_d1 and the reference voltage V_ref. That is to say, the first comparing section 131-1 compares the voltage levels of the first sensing voltage V_d1 and the reference voltage V_ref, and causes the voltage level of one node of the second node Node_B and the third node Node_C to become lower than the voltage level of the other node. For instance, when the voltage level of the first sensing voltage V_d1 is higher than the voltage level of the reference voltage V_ref, the first comparing section 131-1 causes the voltage level of the third node Node_C to become lower than the voltage level of the second node Node_B. Also, when the voltage level of the first sensing voltage V_d1 is lower than the voltage level of the reference voltage V_ref, the first comparing section 131-1 causes the voltage level of the second node Node_B to become lower than the voltage level of the third node Node_C.

The first comparing section 131-1 includes ninth and tenth transistors N5 and N6. The ninth transistor N5 has the gate which is applied with the first sensing voltage V_d1, the drain to which the second node Node_B is electrically coupled, and the source to which the ground terminal VSS is electrically coupled. The tenth transistor N6 has the gate which is applied with the reference voltage V_ref, the drain to which the third node Node_C is electrically coupled, and the source to which the ground terminal VSS is electrically coupled.

The first latch section 131-2 is configured to generate the first comparison signal com1 according to the voltage levels of the second node Node_B and the third node Node_C, and latch the first comparison signal com1. For example, the first latch section 131-2 enables or disables the first comparison signal com1 according to the voltage level of a node which has a lower voltage level, between the second node Node_B and the third node Node_C.

The first latch section 131-2 includes eleventh to fourteenth transistors P5, P6, N7 and N8. The eleventh transistor P5 has the source which is applied with the external voltage VDD. The twelfth transistor P6 has the source which is applied with the external voltage VDD. The thirteenth transistor N7 has the gate to which the gate of the eleventh transistor P5 is electrically coupled, the drain to which the drain of the eleventh transistor P5 is electrically coupled, and the source to which the second node Node_B is electrically coupled. The fourteenth transistor N8 has the gate to which the gate of the twelfth transistor P6 is electrically coupled, the drain to which the drain of the twelfth transistor P6 is electrically coupled, and the source to which the third node Node_C is electrically coupled. The node, to which the drain of the eleventh transistor P5 and the drain of the thirteenth transistor N7 are electrically coupled, and the node, to which the gate of the twelfth transistor P6 and the gate of the fourteenth transistor N8 are electrically coupled, are electrically coupled with each other. The first comparison signal com1 is generated from the node to which all of the eleventh to fourteenth transistors P5, P6, N7 and N8 are commonly electrically coupled.

The first driver 141 is configured to drive the first comparison signal com1, and output the first write driver control signal ctrl_wd<0>.

The first driver 141 includes first and second inverters IV1 and IV2 which are electrically coupled in series. The first inverter IV1 is inputted with the first comparison signal com1, and the second inverter IV2 outputs the first write driver control signal ctrl_wd<0>.

The second sensing voltage generation unit 122 is configured to apply a voltage to the second dummy memory element 112, and generate the second sensing voltage V_d2 which corresponds to the resistance value of the second dummy memory element 112.

The second sensing voltage generation unit 122 includes a second current generating section 122-1 and a second voltage converting section 122-2.

The second current generating section 122-1 is configured to apply a voltage to the second dummy memory element 112, and generate the same current as the current supplied to the second dummy memory element 112. The second current generating section 122-1 is configured in the same manner as the first current generating section 121-1.

The second voltage converting section 122-2 is configured to generate the second sensing voltage V_d2 of a voltage level that corresponds to the amount of current generated by the second current generating section 122-1. For example, the second voltage converting section 122-2 is electrically coupled to a fourth node Node_D, and the fourth node Node_D is supplied with the current generated by the second current generating section 122-1. The second voltage converting section 122-2 flows the amount of current corresponding to a second bias voltage V_bias2, from the fourth node Node_D to the ground terminal VSS. If the amount of the current supplied to the fourth node Node_D, that is, the current generated by the second current generating section 122-1, is larger than the amount of current which is flowed to the ground terminal VSS by the second voltage converting section 122-2, the voltage of the fourth node Node_D rises or increases. If the amount of the current supplied to the fourth node Node_D, that is, the current generated by the second current generating section 122-1 is smaller or less than the amount of current which is flowed to the ground terminal VSS by the second voltage converting section 122-2, the voltage of the fourth node Node_D falls. The voltage level of the fourth node Node_D is the voltage level of the second sensing voltage V_d2.

The second voltage converting section 122-2 is configured in the same manner as the first voltage converting section 121-2.

The second latch type comparison unit 132 is configured to compare the second sensing voltage V_d2 and the reference voltage V_ref, and generate a second comparison signal com2.

The second latch type comparison unit 132 includes a second comparing section 132-1 and a second latch section 132-2.

The second comparing section 132-1 is configured to determine the voltage levels of a fifth node Node_E and a sixth node Node_F according to the voltage levels of the second sensing voltage V_d2 and the reference voltage V_ref. That is to say, the second comparing section 132-1 compares the voltage levels of the second sensing voltage V_d2 and the reference voltage V_ref, and causes the voltage level of one node of the fifth node Node_E and the sixth node Node_F to become lower than the voltage level of the other node. For instance, when the voltage level of the second sensing voltage V_d2 is higher or greater than the voltage level of the reference voltage V_ref, the second comparing section 132-1 causes the voltage level of the sixth node Node_F to become lower or less than the voltage level of the fifth node Node_E. Also, when the voltage level of the second sensing voltage V_d2 is lower or less than the voltage level of the reference voltage V_ref, the second comparing section 132-1 causes the voltage level of the fifth node Node_E to become lower or less than the voltage level of the sixth node Node_F.

The second comparing section 132-1 is configured in the same manner as the first comparing section 131-1.

The second latch section 132-2 is configured to generate the second comparison signal com2 according to the voltage levels of the fifth node Node_E and the sixth node Node_F, and latch the second comparison signal com2. For example, the second latch section 132-2 enables or disables the second comparison signal com2 according to the voltage level of a node which has a lower voltage level, between the fifth node Node_E and the sixth node Node_F.

The second latch section 132-2 is configured in the same manner as the first latch section 131-2.

The second driver 142 is configured to drive the second comparison signal com2, and output the second write driver control signal ctrl_wd<1>.

The second driver 142 is configured in the same manner as the first driver 141.

Figure 3:
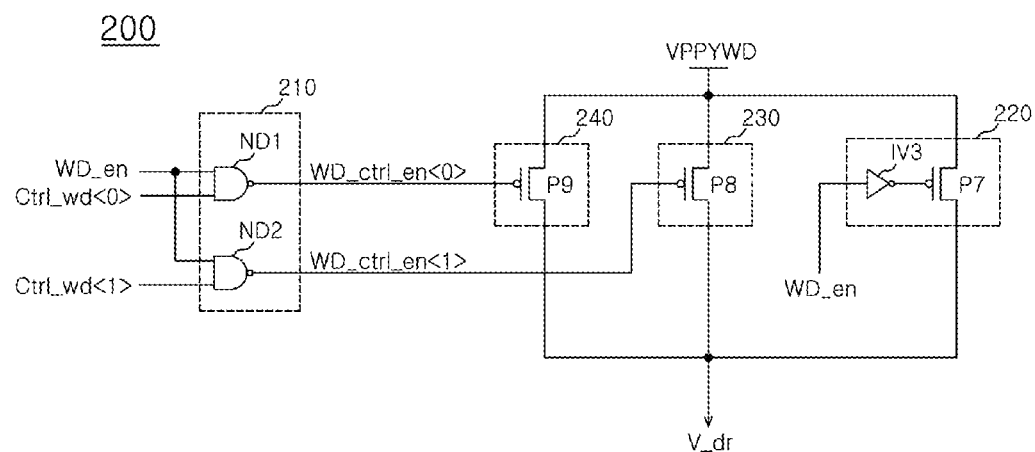
FIG. 3 is a configuration diagram of the write driving block of FIG. 1.

Referring to FIG. 3, the write driving block 200 includes a write driver control enable signal generation unit 210, and first to third write drivers 220, 230 and 240.

The write driver control enable signal generation unit 210 is configured to generate first and second write driver control enable signals WD_ctrl_en<0:1> in response to the write driver enable signal WD_en and the first and second write driver control signals ctrl_wd<0:1>. For instance, the write driver control enable signal generation unit 210 generates the first and second write driver control enable signals WD_ctrl_en<0:1> in response to the first and second write driver control signals ctrl_wd<0:1> when the write driver enable signal WD_en is enabled. Further, the write driver control enable signal generation unit 210 disables both the first and second write driver control enable signals WD_ctrl_en<0:1> regardless of the first and second write driver control signals ctrl_wd<0:1> when the write driver enable signal WD_en is disabled.

The write driver control enable signal generation unit 210 includes first and second NAND gates ND1 and ND2. The first NAND gate ND1 is inputted with the write driver enable signal WD_en and the first write driver control signal ctrl_wd<0>, and generates the first write driver control enable signal WD_ctrl_en<0>. The second NAND gate ND2 is inputted with the write driver enable signal WD_en and the second write driver control signal ctrl_wd<1>, and generates the second write driver control enable signal WD_ctrl_en<1>.

The first write driver 220 is configured to output a high voltage VPPYWD for writing, the high voltage VPPYWD is as high as the driving voltage V_dr when the write driver enable signal WD_en is enabled. Since the first write driver 220 is controlled by only the write driver enable signal WD_en, the first write driver 220 may be referred to as a main driver.

The first write driver 220 includes a fifteenth transistor P7 and a third inverter IV3. The third inverter IV3 receives the write driver enable signal WD_en. The fifteenth transistor P7 has the gate which is inputted with an output of the third inverter IV3, and the source which is applied with the high voltage VPPYWD for writing.

The second write driver 230 is configured to output the high voltage VPPYWD for writing, as the driving voltage V_dr when the second write driver control enable signal WD_ctrl_en<1> is enabled.

The second write driver 230 includes a sixteenth transistor P8. The sixteenth transistor P8 has the gate which is inputted with the second write driver control enable signal WD_ctrl_en<1>, and the source which is applied with the high voltage VPPYWD for writing.

The third write driver 240 is configured to output the high voltage VPPYWD for writing, the high voltage VPPYWD being the driving voltage V_dr when the first write driver control enable signal WD_ctrl_en<0> is enabled.

The third write driver 240 includes a seventeenth transistor P9. The seventeenth transistor P9 has the gate which is inputted with the first write driver control enable signal WD_ctrl_en<0>, and the source which is applied with the high voltage VPPYWD for writing. The output terminals of the first to third write drivers 220, 230 and 240 are commonly electrically coupled, and the driving voltage V_dr is outputted from the node to which the output terminals of the first to third write drivers 220, 230 and 240 are commonly electrically coupled. Since the second and third write drivers 230 and 240 are controlled by the write driver enable signal WD_en and the first and second write driver control enable signals WD_ctrl_en<0:1>, the second and third write drivers 230 and 240 may be referred to as sub drivers.

The semiconductor memory apparatus in accordance with the embodiments of the present disclosure, configured as mentioned above, may operate as follows.

A resistive memory element is changed in its resistance value, according to the amount of current applied to it, and the resistance value is stored as the value of data.

Such a memory element has one end which is applied with current and the other end which flows current to a ground terminal. The other end through which the memory element flows current to the ground terminal, that is, the bottom electrode of the memory element may be changed in its resistance value according to a process, a voltage and a temperature. If the resistance value of the bottom electrode of the memory element is changed in this way, since the resistance value of the memory element is changed, an amount of current to be applied to the memory element should be changed in the case of storing data.

In the embodiments of the present disclosure, in the event that the resistance value of the memory element is changed from the resistance value set by the bottom electrode as described above, a write driving block for supplying a driving voltage to the memory element controls the amount of current to be supplied to the memory element.

Referring to FIG. 1, dummy memory elements may be memory elements which are formed by modeling memory elements included in a memory cell array, or may be memory elements included in a memory cell array. The dummy memory elements are not used as memory elements for reading and writing data, and have initial resistance values when memory elements are formed through processes.

Referring to FIG. 2, if the option signal OPT_en is enabled, the first sensing voltage generation unit 121 supplies the external voltage VDD to the first dummy memory element 111, and generates the first sensing voltage V_d1 of a voltage level corresponding to the resistance value of the first dummy memory element 111. In detail, the first current generating section 121-1 of the first sensing voltage generation unit 121 supplies the external voltage VDD to the first dummy memory element 111 when the option signal OPT_en is enabled. If the external voltage VDD is supplied to the first dummy memory element 111, according to the resistance value of the first dummy memory element 111, the amount of current flowing through the first dummy memory element 111 to the ground terminal VSS is determined. In other words, if the resistance value of the first dummy memory element 111 is large, the amount of current flowing through the first dummy memory element 111 to the ground terminal VSS decreases. Therefore, the amount of current supplied to the first dummy memory element 111 from the first current generating section 121-1 decreases. Since the transistor P2 and the transistor P3 are applied with the same voltages through the gates and the drains thereof, the amount of current flowing through the transistor P2 is the same as the amount of current flowing through the transistor P3. As a result, the first current generating section 121-1 supplies the same amount of current as the amount of current supplied to the first dummy memory element 111, to the first node Node_A.

The first voltage converting section 121-2 flows the amount of current corresponding to the voltage level of the first bias voltage V_bias1, from the first node Node_A to the ground terminal VSS.

Consequently, if the amount of current flowing from the first node Node_A to the ground terminal VSS is larger than the amount of current applied to the first node Node_A, the voltage level of the first node Node_A falls or decreases, and in an opposite case, the voltage level of the first node Node_A rises or increases. The voltage level of the first node Node_A is the voltage level of the first sensing voltage V_d1.

The first latch type comparison unit 131 compares the voltage levels of the first sensing voltage V_d1 and the reference voltage V_ref, generates the first comparison signal com1, and latches the first comparison signal com1. For instance, in the case where the first sensing voltage V_d1 is higher than the reference voltage V_ref, the first latch type comparison unit 131 disables the first comparison signal com1. In the case where the first sensing voltage V_d1 is lower than the reference voltage V_ref, the first latch type comparison unit 131 enables the first comparison signal com1.

The first driver 141 drives the first comparison signal com1 and outputs the first write driver control signal ctrl_wd<0>.

The second current generating section 122-1 of the second sensing voltage generation unit 122 supplies the external voltage VDD to the second dummy memory element 112 when the option signal OPT_en is enabled. If the external voltage VDD is supplied to the second dummy memory element 112, according to the resistance value of the second dummy memory element 112, the amount of current flowing through the second dummy memory element 112 to the ground terminal VSS is determined. In other words, if the resistance value of the second dummy memory element 112 is large, the amount of current flowing through the second dummy memory element 112 to the ground terminal VSS decreases. Therefore, the amount of current supplied to the second dummy memory element 112 from the second current generating section 122-1 decreases. The second current generating section 122-1 supplies the same amount of current as the amount of current supplied to the second dummy memory element 112, to the fourth node Node_D.

The second voltage converting section 122-2 flows the amount of current corresponding to the voltage level of the second bias voltage V_bias2, from the fourth node Node_D to the ground terminal VSS.

Consequently, if the amount of current flowing from the fourth node Node_D to the ground terminal VSS is larger than the amount of current applied to the fourth node Node_D, the voltage level of the fourth node Node_D falls, and in an opposite case, the voltage level of the fourth node Node_D rises. The voltage level of the fourth node Node_D is the voltage level of the second sensing voltage V_d2.

The second latch type comparison unit 132 compares the voltage levels of the second sensing voltage V_d2 and the reference voltage V_ref, generates the second comparison signal com2, and latches the second comparison signal com2. For instance, in the case where the second sensing voltage V_d2 is higher than the reference voltage V_ref, the second latch type comparison unit 132 disables the second comparison signal com2. In the case where the second sensing voltage V_d2 is lower than the reference voltage V_ref, the second latch type comparison unit 132 enables the second comparison signal com2.

The second driver 142 drives the second comparison signal com2 and outputs the second write driver control signal ctrl_wd<1>.

Referring to FIG. 3, the write driving block 200 generates the first and second write driver control enable signals WD_ctrl_en<0:1> in response to the write driver enable signal WD_en and the first and second write driver control signals ctrl_wd<0:1>. Further, the write driving block 200 determines the number of write drivers which generate the driving voltage V_dr in response to the first and second write driver control enable signals WD_ctrl_en<0:1>, that is, are turned on.

Operations of the semiconductor memory apparatus in accordance with the embodiments of the present disclosure will be described on the basis of the above descriptions.

First, the case where the resistance values of the first and second dummy memory elements 111 and 112 are a preset resistance level will be described.

The first bias voltage V_bias1 is set in such a manner that the voltage level of the first sensing voltage V_d1 becomes lower than the voltage level of the reference voltage V_ref according to the resistance value of the first dummy memory element 111 and the voltage level of the first bias voltage V_bias1.

The second bias voltage V_bias2 is set in such a manner that the voltage level of the second sensing voltage V_d2 becomes higher than the voltage level of the reference voltage V_ref according to the resistance value of the second dummy memory element 112 and the voltage level of the second bias voltage V_bias2. The voltage level of the first bias voltage V_bias1 which is set is lower than the voltage level of the second bias voltage V_bias2 which is set.

In the case where the voltage level of the first sensing voltage V_d1 is lower than the reference voltage V_ref, the first comparison signal com1 is enabled to a high level.

In the case where the voltage level of the second sensing voltage V_d2 is higher than the reference voltage V_ref, the second comparison signal com2 is disabled to a low level.

The respective first and second comparison signals com1 and com2 are driven and are outputted as the first and second write driver control signals ctrl_wd<0:1>. The first write driver control signal ctrl_wd<0> is disabled to a high level, and the second write driver control signal ctrl_wd<1> is enabled to a low level.

If the write driver enable signal WD_en is enabled, the first write driver control signal ctrl_wd<0> is inverted and is outputted as the first write driver control enable signal WD_ctrl_en<0>, and the second write driver control signal ctrl_wd<1> is inverted and is outputted as the second write driver control enable signal WD_ctrl_en<1>. Namely, if the write driver enable signal WD_en is enabled to a high level, the first write driver control signal ctrl_wd<0> of the high level is outputted as the first write driver control enable signal WD_ctrl_en<0> which is enabled to a low level. Also, if the write driver enable signal WD_en is enabled to the high level, the second write driver control signal ctrl_wd<1> of the low level is outputted as the second write driver control enable signal WD_ctrl_en<1> which is disabled to a high level.

The first write driver 220 is inputted with the write driver enable signal WD_en which is enabled to a low level, and is turned on.

The second write driver 230 is inputted with the second write driver control enable signal WD_ctrl_en<1> which is disabled to the high level, and is turned off.

The third write driver 240 is inputted with the first write driver control enable signal WD_ctrl_en<0> which is enabled to the low level, and is turned on.

As a result, in the case where the first and second dummy memory elements 111 and 112 have the preset resistance value, the first and third write drivers 220 and 240 are turned on and generate the driving voltage V_dr. The driving voltage V_dr is applied to the memory cell array 300.

Second, the case where the resistance values of the first and second dummy memory elements 111 and 112 are larger than the preset resistance level will be described.

If the resistance values of the first and second dummy memory elements 111 and 112 are larger than the preset voltage level, the amounts of current applied to the first node Node_A and the fourth node Node_D decrease.

Therefore, the voltage levels of the first and second sensing voltages V_d1 and V_d2 become lower than the voltage level of the reference voltage V_ref.

If the voltage levels of the first and second sensing voltages V_d1 and V_d2 become lower than the voltage level of the reference voltage V_ref, the first and second comparison signals com1 and com2 become high levels.

The first and second comparison signals com1 and com2 are outputted as the first and second write driver control signals ctrl_wd<0:1>.

If the write driver enable signal WD_en is enabled, the first and second write driver control signals ctrl_wd<0:1> are inverted and outputted as the first and second write driver control enable signals WD_ctrl_en<0:1> which are enabled to low levels.

All of the first to third write drivers 220, 230 and 240 are turned on and generate the driving voltage V_dr.

Third, the case where the resistance values of the first and second dummy memory elements 111 and 112 are smaller or less than the preset resistance level will be described.

If the resistance values of the first and second dummy memory elements 111 and 112 are smaller or less than the preset voltage level, the amounts of current applied to the first node Node_A and the fourth node Node_D increase.

Therefore, the voltage levels of the first and second sensing voltages V_d1 and V_d2 become higher or larger than the voltage level of the reference voltage V_ref.

If the voltage levels of the first and second sensing voltages V_d1 and V_d2 become higher than the voltage level of the reference voltage V_ref, the first and second comparison signals com1 and com2 become low levels.

The first and second comparison signals com1 and com2 are outputted as the first and second write driver control signals ctrl_wd<0:1>.

If the write driver enable signal WD_en is enabled, the first and second write driver control signals ctrl_wd<0:1> are inverted and outputted as the first and second write driver control enable signals WD_ctrl_en<0:1> which are disabled to high levels. The first and second write driver control enable signals WD_ctrl_en<0:1> which are disabled turn off the second and third write drivers 230 and 240.

Only the first write driver 220 is turned on among the first to third write drivers 220, 230 and 240 and generates the driving voltage V_dr.

As is apparent from the above descriptions, the semiconductor memory apparatus in accordance with the embodiments of the present disclosure generate sensing voltages according to the resistance values of dummy memory elements, that is, the resistance values of the bottom electrodes of the dummy memory elements, compares the voltage levels of the sensing voltages and the voltage level of a reference voltage, and controls the number of drivers for applying a driving voltage to a memory cell array. The embodiments of the present disclosure suggests a technology in which two write drivers provide the driving voltage to the memory cell array when the resistance values of the dummy memory elements are a preset level, one write driver provides the driving voltage to the memory cell array when the resistance values of the dummy memory elements are lower than the preset level, and three write drivers provide the driving voltage to the memory cell array when the resistance values of the dummy memory elements are higher than the preset level. However, it may fall under an easy design change for a person skilled in the art to control the number of entire write drivers and the number of write drivers to be turned on, according to the resistance values of dummy memory elements, by referring to the invention concept of the semiconductor memory apparatus according to the present disclosure.

Figure 4:
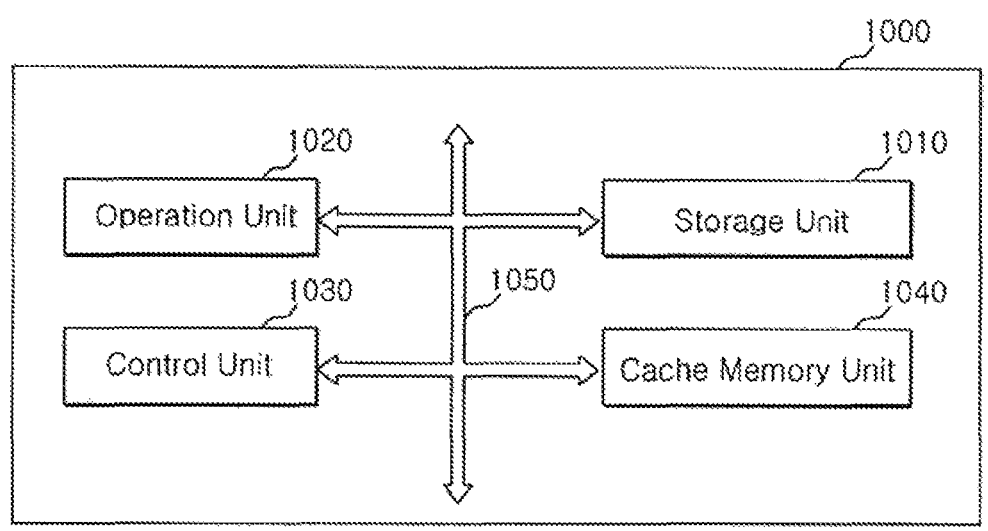
FIG. 4 is a block diagram illustrating a microprocessor according to an embodiment of the inventive concept.

Additionally, As illustrated in FIG. 4, a microprocessor As illustrated in FIG. 4, a microprocessor 1000 to which the semiconductor memory apparatus according to the embodiments is applied may control and adjust a series of processes, which receive data from various external apparatuses, process the data and transmit processing results to the external apparatuses. The microprocessor 1000 may include a storage unit 1010, an operation unit 1020, and a control unit 1030. The microprocessor 1000 may be a variety of processing apparatuses, such as a central processing unit (CPU), a graphic processing unit (GPU), a digital signal processor (DSP), or an application processor (AP).

The storage unit 1010 may be a processor register or a register, and the storage unit may be a unit that may store data in the microprocessor 1000 and include a data register, an address register, and a floating point register. The storage unit 1010 may include various registers other than the above-described registers. The storage unit 1010 may temporarily store data to be operated in the operation unit 1020, resulting data performed in the operation unit 1020, and an address in which data to be operated is stored.

The storage unit 1010 may include one of the semiconductor memory apparatuses according to embodiments. The storage unit 1010 including the semiconductor memory apparatus according to the above-described embodiments may include: a driving current control block configured to sense a resistance value of a dummy memory element, and generate a write driver control signal; and a write driving block configured to provide a driving voltage to a memory cell array in response to a write driver enable signal and the write driver control signal. The detailed configuration of the semiconductor memory apparatus may be the same as the structures of FIGS. 1-3.

The operation unit 1020 may perform an operation in the microprocessor 1000, and perform a variety of four fundamental rules of an arithmetic operation or a logic operation depending on a decryption result of a command in the control unit 1030. The operation unit 1020 may include one or more arithmetic and logic units (ALU).

The control unit 1030 receives a signal from the storage unit 1010, the operation unit 1020, or an external apparatus of the microprocessor 1000, performs extraction or decryption of a command, or input or output control, and executes a process in a program form.

The microprocessor 1000 according to the embodiment may further include a cache memory unit 1040 suitable for temporarily storing data input from an external apparatus other than the storage unit 1010 or data to be output to an external apparatus. At this time, the cache memory unit 1040 may exchange data from the storage unit 1010, the operation unit 1020, and the control unit 1030 through a bus interface 1050.

Additionally, the cache memory unit 1040 may include one of the semiconductor memory apparatuses according to embodiments. The cache memory unit 1040 including the semiconductor memory apparatus according to the above-described embodiments may include: a driving current control block configured to sense a resistance value of a dummy memory element, and generate a write driver control signal; and a write driving block configured to provide a driving voltage to a memory cell array in response to a write driver enable signal and the write driver control signal. The detailed configuration of the semiconductor memory apparatus may be the same as the structures of FIGS. 1-3.

Figure 5:
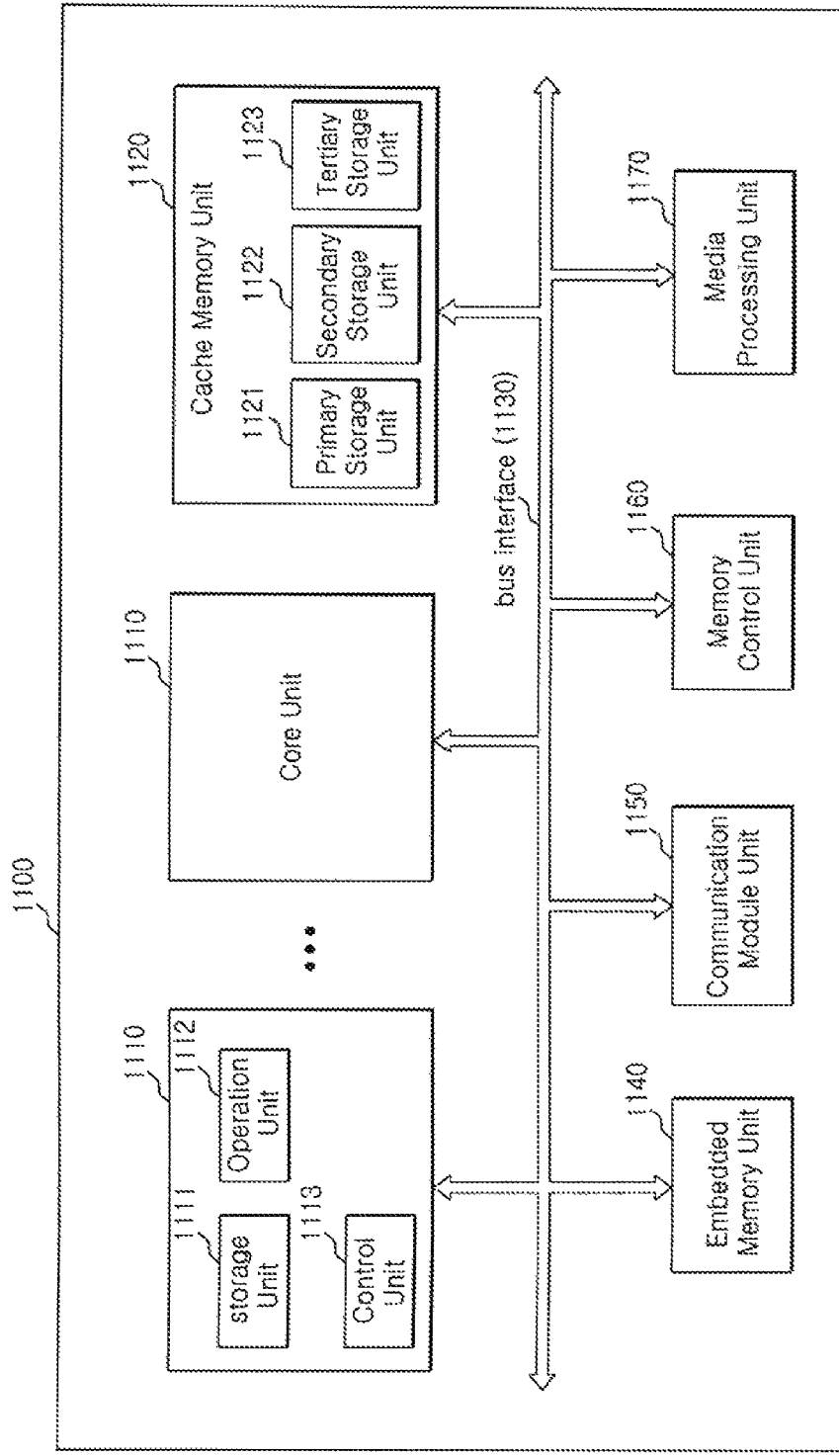
FIG. 5 is a block diagram illustrating a processor according to an embodiment of the inventive concept.

As illustrated in FIG. 5, a processor 1100 according to the embodiment may include various functions to implement performance improvement and multifunction other than the functions of the microprocessor that may control and adjust a series of processes, which receive data from various external apparatuses, process the data and transmit processing results to the external apparatuses. The processor 1100 may include a core unit 1110, a cache memory unit 1120, and a bus interface 1130. The core unit 1110 in the embodiment is a unit may perform arithmetic and logic operations on data input from an external apparatus, and include a storage unit 1111, an operation unit 1112, and a control unit 1113. The processor 1100 may be a variety of system on chips (SoCs) such as a multi core processor (MCP), a GPU, and an AP.

The storage unit 1111 may be a processor register or a register, and the storage unit 1111 may be a unit may store data in the processor 1000 and include a data register, an address register, and a floating point register. The storage unit 1111 may include various registers other than the above-described registers. The storage unit 1111 may temporarily store data to be operated in the operation unit 1112, resulting data performed in the operation unit 1112 and an address in which data to be operated is stored. The operation unit 1112 may be a unit that may perform an operation in the inside of the processor 1100, and perform a variety of four fundamental rules of an arithmetic operation or a logic operation depending on a decryption result of a command in the control unit 1113. The operation unit 1112 may include one or more arithmetic and logic unit (ALU). The control unit 1113 receives a signal from the storage unit 1111, the operation unit 1112, and an external apparatus of the processor 1100, performs extraction or decryption of a command, or input or output control, and executes a process in a program form.

The cache memory unit 1120 may be temporarily store data to supplement a data processing rate of a low speed external apparatus unlike the high speed core unit 1110. The cache memory unit 1120 may include a primary storage unit 1121, a secondary storage unit 1122, and a tertiary storage unit 1123. In general, the cache memory unit 1120 may include the primary and secondary storage units 1121 and 1122. When a high capacity storage unit is necessary, the cache memory unit 1120 may include the tertiary storage unit 1123. If necessary, the cache memory 1120 may include more storage units. That is, the number of storage units included in the cache memory unit 1120 may be changed according to design. Here, processing rates of data storage and discrimination of the primary, secondary, and tertiary storage units 1121, 1122, and 1123 may be the same or different. When the processing rates of the storage units are different, the processing rate of the primary storage unit is the greatest. One or more of the primary storage unit 1121, the secondary storage unit 1122, and the tertiary storage unit 1123 in the cache memory unit may include one of the semiconductor memory apparatus according to embodiments. The cache memory unit 1120 including the semiconductor memory apparatus according to the above-described embodiments may include a semiconductor memory apparatus including a driving current control block configured to sense a resistance value of a dummy memory element, and generate a write driver control signal; and a write driving block configured to provide a driving voltage to a memory cell array in response to a write driver enable signal and the write driver control signal. The detailed configuration of the semiconductor memory apparatus may be the same as the structures of FIGS. 1-3.

FIG. 5 has illustrated that all the primary, secondary, tertiary storage units 1121, 1122, and 1123 are formed in the cache memory unit 1120. However, all the primary, secondary, tertiary storage units 1121, 1122, and 1123 may be formed in the outside of the cache memory unit 1120, and may supplement a difference between the processing rate of the core unit 1110 and an external apparatus. Further, the primary storage unit 1121 of the cache memory unit 1120 may be located in the core unit 1110, and the secondary storage unit 1122 and the tertiary storage unit 1123 may be formed in the outside of the core unit 1110 to enforce a function to compensate a processing rate.

The bus interface 1130 is a unit that may couple the core unit 1110 and the cache memory unit 1120 to efficiently transmit data.

The processor unit 1100 according to the embodiment may include a plurality of core units 1110, and the core units 1110 may share a cache memory unit 1120. The core units 1110 and the cache memory unit 1120 may be coupled through the bus interface 1130. The core units 1110 may have the same configuration as the configuration of the above-described core unit 1110. When the core units 1110 are provided, the primary storage unit 1121 of the cache memory unit 1120 may be formed in each of the core units 1110 corresponding to the number of core units 1110, and the secondary storage unit 1122 and the tertiary storage unit 1123 may be formed in one body in the outsides of the core units 1110 to be shared through the bus interface 1130 Here, the processing rate of the primary storage unit 1121 may be larger than those of the secondary and tertiary storage units 1122 and 1123.

The processor 1100 according to the embodiment may further include an embedded memory unit 1140 that may store data, a communication module unit 1150 that may transmit and receive data from an external apparatus in a wired manner or a wireless manner, a memory control unit 1160 that may drive an external storage device, a media processing unit 1170 that may process data processed in the processor 1100 or data input from an external apparatus and outputting a processing result to an external interface device, and a plurality of modules. At this time, the modules may transmit data to and receive data from the core unit 1110 and the cache memory unit 1120, and transmit and receive data between the modules, through the bus interface 1130.

The embedded memory unit 1140 may include a volatile memory or a nonvolatile memory. The volatile memory may include a dynamic random access memory (DRAM), a mobile DRAM, a static random access memory (SRAM), and the like, and the nonvolatile memory may include a read only memory (ROM), a NOR flash memory, a NAND flash memory, a phase-change random access memory (PRAM), a resistive RAM (RRAM), a spin transfer torque RAM (STTRAM), a magnetic RAM (MRAM), and the like. The semiconductor memory apparatus according to the embodiments may be applied to the embedded memory unit 1140.

The communication module unit 1150 may include all modules such as a module coupled to a wired network and a module coupled to a wireless network. The wired network module may include a local area network (LAN), a universal serial bus (USB), Ethernet, a power line communication (PLC), and the like, and the wireless network module may include Infrared Data Association (IrDA), Code Division Multiple Access (CDMA), Time Division Multiple Access (TDMA), Frequency Division Multiple Access (FDMA), a wireless LAN, Zigbee, a Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), and the like.

The memory control unit 1160 may be a unit that may manage data transmitted between the processor 1100 and an external apparatus that may operate according to a different communication standard from the processor 1100. The memory control unit 1160 may include a variety of memory controllers, or a controller that may control Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCM-CIA), a USB, a secure digital (SD) card, a mini secure digital (mSD) card, a micro SD card, a secure digital high capacity (SDHC) card, a memory stick card, a smart media card (SM), a multi media card (MMC), an embedded MMC (eMMC), a compact flash (CF) card, or the like.

The media processing unit 1170 may be a unit that may process data processed in the processor 1100 or data input from an external input device and outputting a processing result to an external interface device so that the processing result may be transferred in video, a voice, and other types. The media processing unit 1170 may include a GPU, a DSP, a HD audio, a high definition multimedia interface (HDMI) controller, or the like.

Figure 6:
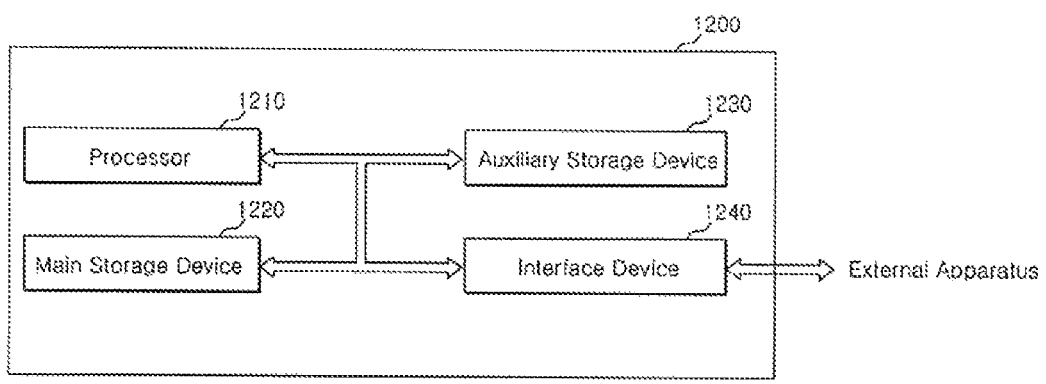
FIG. 6 is a block diagram illustrating a system according to an embodiment of the inventive concept.

As illustrated in FIG. 6, a system 1200 to which the semiconductor memory apparatus according to an embodiment of the inventive concept is applied is a data processing apparatus. The system 1200 may perform input, processing, output, communication, storage, and the like to perform a series of operations on data, and include a processor 1210, a main storage device 1220, an auxiliary storage device 1230, and an interface device 1240. The system according to the embodiment may be a variety of electronic systems that may operate by using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, Telematics, an audio visual (AV) system, or a smart television.

The processor 1210 is a core configuration of the system that may control interpretation of an input command and processing an operation, comparison, and the like of data stored in the system, and may be formed of a MPU, a CPU, a single/multi core processor, a GPU, an AP, a DSP, or the like.

The main storage unit 1220 is a storage place that may receive a program or data from the auxiliary storage device 1230 and execute the program or the data. The main storage device 1220 retains the stored content even in power off, and may include the semiconductor memory apparatus according to the above-described embodiment. The main storage device 1220 may use a semiconductor memory apparatus including a driving current control block configured to sense a resistance value of a dummy memory element, and generate a write driver control signal; and a write driving block configured to provide a driving voltage to a memory cell array in response to a write driver enable signal and the write driver control signal. The detailed configuration of the semiconductor memory apparatus may be the same as the structures of FIGS. 1-3.

The main storage device 1220 according to the embodiment may further include an SRAM or a DRAM of a volatile memory type in which all contents are erased in power off. Alternatively, the main storage device 1220 may not include the semiconductor memory apparatus according to the embodiments but may include an SRAM or a DRAM of a volatile memory type in which all contents are erased in power off.

The auxiliary storage device 1230 is a storage device that may store a program code or a data. The auxiliary storage device 1230 may have a lower data processing rate than that of the main storage device 1220, but may store a large amount of data and include the semiconductor memory apparatus according to the above-described embodiments. The auxiliary storage unit 1230 may also use a semiconductor memory apparatus including a driving current control block configured to sense a resistance value of a dummy memory element, and generate a write driver control signal; and a write driving block configured to provide a driving voltage to a memory cell array in response to a write driver enable signal and the write driver control signal. The detailed configuration of the semiconductor memory apparatus may be the same as the structures of FIGS. 1-3.

An area of the auxiliary storage device 1230 according to the embodiment may be decreased, to reduce a size of the system 1200 and increase portability of the system 1200. Further, the auxiliary storage device 1230 may further include a data storage system, such as a magnetic tape and a magnetic disc using a magnetism, a laser disc using light, a magneto-optical disc using a magnetism and light, an SSD, a USB memory, a SD card, a mSD card, a micro SD card, a SDHC card, a memory stick card, a smart media card, a MMC card, an eMMC, or a CF card. Unlike this, the auxiliary storage device 1230 may not include the semiconductor memory apparatus according to the above-described embodiments but may include a data storage system, such as a magnetic tape and a magnetic disc using a magnetism, a laser disc using light, a magneto-optical disc using a magnetism and light, an SSD, a USB memory, a SD card, a mSD card, a micro SD card, a SDHC card, a memory stick card, a smart media card, a MMC card, an eMMC, or a CF card.

The interface device 1240 may exchange a command and data of an external apparatus with the system of the embodiment, and may be a keypad, a keyboard, a mouse, a speaker, a mike, a display, a variety of Human Interface Devices (HIDs), or a communication device. The communication device may include all modules such as a module coupled to a wired network or a module coupled to a wireless network. The wired network module may include a LAN, a USB, Ethernet, a power line communication (PLC), or the like, and the wireless network module may include Infrared Data Association (IrDA), Code Division Multiple Access (CDMA), Time Division Multiple Access (TDMA), Frequency Division Multiple Access (FDMA), a wireless LAN, Zigbee, a Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), or the like.

As specifically described above, the memory device according to the embodiments may provide a driving current control block configured to sense a resistance value of a dummy memory element, and generate a write driver control signal; and a write driving block configured to provide a driving voltage to a memory cell array in response to a write driver enable signal and the write driver control signal.

While various embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a driving current control block configured to receive an option signal, sense resistance values of a plurality of dummy memory elements during an enable period of the option signal, and generate a plurality of write driver control signals; and
a write driving block configured to determine the number of write drivers for generating a driving voltage, in response to a write driver enable signal and the plurality of write driver control signals,
wherein the dummy memory elements are directly coupled to the driving current control block,
wherein the write driving block includes the write drivers,
wherein the number of the write drivers outputting the driving voltage corresponds to the number of write driver control signals which are enabled among the plurality of write driver control signals.

2. The semiconductor memory apparatus according to claim 1, wherein the driving current control block retains values of the plurality of write driver control signals which are generated by sensing the resistance values of the plurality of dummy memory elements, even after the option signal is disabled.

3. The semiconductor memory apparatus according to claim 2, wherein the driving current control block comprises:
a plurality of sensing voltage generation units configured to apply voltages to the plurality of dummy memory elements, respectively, and generate a plurality of sensing voltages which correspond to the respective resistance values of the plurality of dummy memory elements;
a plurality of latch type comparison units configured to compare the plurality of respective sensing voltages and a reference voltage, and generate, latch and output a plurality of comparison signals; and
a plurality of drivers configured to drive the plurality of comparison signals, and output the plurality of write driver control signals.

4. The semiconductor memory apparatus according to claim 1, wherein the write driving block increases or decreases the number of write drivers for generating the driving voltage, according to the number of write driver control signals which are enabled among the plurality of write driver control signals, when the write driver enable signal is enabled.

5. A semiconductor memory apparatus comprising:
a driving current control block configured to sense a resistance value of a dummy memory element, and generate at least one write driver control signal; and
a write driving block configured to increase or decrease a number of write drivers for generating a driving voltage according to the number of received write driver control signals and provide the driving voltage to a memory cell array,
wherein the dummy memory element is directly coupled to the driving current control block,
wherein the write driving block includes the write drivers,
wherein the number of the write drivers outputting the driving voltage corresponds to the number of write driver control signals which are enabled among the plurality of write driver control signals.

6. The semiconductor memory apparatus according to claim 5, wherein the write driving block provides the driving voltage to the memory cell array in response to a write driver enable signal.

7. The semiconductor memory apparatus according to claim 5, wherein:

only memory elements of the memory cell array are used for storing data in a data writing operation of the semiconductor memory apparatus; and the memory elements include resistive memory elements having resistance values that correspond to values of data.

8. A microprocessor, comprising:

a control unit configured to receive a signal including a command from the outside and perform extraction or decryption of the command or input or output control;

an operation unit configured to perform an operation according to a decryption result of the command in the control unit; and a storage unit configured to store one or more among data to be operated, data corresponding to a result of the operation, and an address for the data to be operated, wherein the storage unit includes a semiconductor memory apparatus comprises:

a driving current control block configured to sense a resistance value of a dummy memory element, and generate a write driver control signal; and a write driving block configured to provide a driving voltage to a memory cell array in response to a write driver enable signal and the write driver control signal, wherein the dummy memory element is directly coupled to the driving current control block.

9. A processor, comprising:

a core unit configured to perform an operation corresponding to a command input from the outside using data according to the command;

a cache semiconductor device unit configured to store one or more among data to be operated, data corresponding to a result of the operation, and an address for the data to be operated; and a bus interface configured to be connected between the core unit and the cache semiconductor device unit, and transmit data between the core unit and the cache semiconductor device unit, wherein the cache semiconductor device unit includes a semiconductor memory apparatus comprises:

a driving current control block configured to sense a resistance value of a dummy memory element, and generate a write driver control signal; and a write driving block configured to provide a driving voltage to a memory cell array in response to a write driver enable signal and the write driver control signal, wherein the dummy memory element is directly coupled to the driving current control block.

10. A processor, comprising:

a processor configured to interpret a command input from the outside and control an operation of information according to an interpretation result of the command;

an auxiliary storage device configured to store a program for interpretation of the command, and the information;

a main storage device configured to transfer the program and information from the auxiliary storage device and store the program and the information so that the processor performs the operation using the program and information when the program is executed; and an interface device configured to perform communication between the outside and one or more among the processor, the auxiliary storage device, and the main storage device, wherein at least one of the auxiliary storage device and the main storage device includes a semiconductor memory apparatus comprises:

a driving current control block configured to sense a resistance value of a dummy memory element, and generate a write driver control signal; and a write driving block configured to provide a driving voltage to a memory cell array in response to a write driver enable signal and the write driver control signal, wherein the dummy memory element is directly coupled to the driving current control block.

* * * * *